(12) United States Patent
Li et al.

(10) Patent No.: US 10,203,797 B2
(45) Date of Patent: Feb. 12, 2019

(54) FORCE TOUCH STRUCTURE, TOUCH DISPLAY PANEL, DISPLAY APPARATUS

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Changfeng Li, Beijing (CN); Shengji Yang, Beijing (CN); Yingming Liu, Beijing (CN); Haisheng Wang, Beijing (CN); Xiaochuan Chen, Beijing (CN); Xiaoliang Ding, Beijing (CN); Lei Wang, Beijing (CN); Pengcheng Lu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 91 days.

(21) Appl. No.: 15/196,746

(22) Filed: Jun. 29, 2016

(65) Prior Publication Data

US 2017/0220181 A1 Aug. 3, 2017

(30) Foreign Application Priority Data

Jan. 28, 2016 (CN) .......................... 2016 1 0059794

(51) Int. Cl.
*G06F 3/044* (2006.01)
*G06F 3/041* (2006.01)
(Continued)

(52) U.S. Cl.
CPC ............ *G06F 3/0416* (2013.01); *G06F 3/044* (2013.01); *G06F 3/0412* (2013.01);
(Continued)

(58) Field of Classification Search
CPC ........ G06F 3/041; G06F 3/044; G06F 3/0412; G06F 3/0414; G06F 3/0416;
(Continued)

(56) References Cited

U.S. PATENT DOCUMENTS

| | | | | |
|---|---|---|---|---|
| 4,740,781 A | * | 4/1988 | Brown | .................. G06F 3/0412 341/33 |
| 5,680,160 A | * | 10/1997 | LaPointe | .............. H01H 13/702 345/173 |

(Continued)

FOREIGN PATENT DOCUMENTS

| | | |
|---|---|---|
| CN | 103823592 A | 5/2014 |
| CN | 104992627 A | 10/2015 |

(Continued)

OTHER PUBLICATIONS

Office Action received for Chinese Patent Application No. 201610059794.8, dated Dec. 1, 2017, 6 pages (1 page of English Translation and 5 pages of Office Action).

*Primary Examiner* — Dismery Mercedes
(74) *Attorney, Agent, or Firm* — Womble Bond Dickinson (US) LLP

(57) ABSTRACT

The present disclosure proposes a force touch structure, a touch display panel and a display apparatus. The force touch structure comprises a base substrate, a light sensing device located on the base substrate, and a phosphorescence-emitting structure positionally corresponding to the light sensing device. The phosphorescence-emitting structure comprises a first electrode, a second electrode, a phosphorescent layer, and a flexible material layer. The first electrode receives a first voltage signal, the second electrode receives a second voltage signal, and the first electrode and the second electrode are used for forming a capacitor with a constant voltage value under the effects of the first voltage signal and the second voltage signal. The light sensing device is used (Continued)

for receiving phosphorescence emitted by the phosphorescent layer and comparing an intensity of the received phosphorescence with a light intensity detected without force touch to determine the magnitude of force touch.

20 Claims, 6 Drawing Sheets

(51) Int. Cl.
    *H01L 51/50*     (2006.01)
    *G09G 3/34*     (2006.01)
    *G09G 3/12*     (2006.01)
    *H01L 31/0232*     (2014.01)

(52) U.S. Cl.
    CPC ............ *G06F 3/0414* (2013.01); *G09G 3/12* (2013.01); *G09G 3/3406* (2013.01); *H01L 51/5012* (2013.01); *H01L 51/5064* (2013.01); *G06F 2203/04102* (2013.01); *G06F 2203/04103* (2013.01); *G06F 2203/04107* (2013.01); *G06F 2203/04111* (2013.01); *H01L 31/02322* (2013.01); *H01L 2251/5338* (2013.01)

(58) Field of Classification Search
    CPC . G06F 2203/04102; G06F 2203/04103; H01L 2251/5338; H01L 51/5016; H01L 51/5012; H01L 51/5064; H01L 27/3225; H01L 31/02322; G09G 3/342; G09G 3/3406; G09G 3/3208; G02F 1/13338
    See application file for complete search history.

(56) References Cited

U.S. PATENT DOCUMENTS

| | | | | |
|---|---|---|---|---|
| 6,507,156 B2* | 1/2003 | Aitchison | ............ | C09K 11/574 315/169.1 |
| 7,258,469 B2* | 8/2007 | Manico | ................ | H03K 17/962 200/314 |
| 7,638,938 B2* | 12/2009 | Aoyama | ................ | H05B 33/10 313/502 |
| 7,671,825 B2* | 3/2010 | Uchiyama | ............ | G09G 3/3216 345/76 |
| 8,110,765 B2* | 2/2012 | Marcus | ................ | H01H 13/83 200/511 |
| 8,638,314 B2* | 1/2014 | Sleeman | ............... | G06F 3/0412 178/18.01 |
| 8,648,782 B2* | 2/2014 | Honda | ................... | G09G 3/32 345/50 |
| 9,116,570 B2* | 8/2015 | Lee | ...................... | G06F 3/0416 |
| 9,208,744 B2* | 12/2015 | Fukunaga | ............ | G09G 3/3696 |
| 9,293,088 B2* | 3/2016 | Yoshida | ................ | G09G 3/2022 |
| 9,557,846 B2* | 1/2017 | Baharav | ................ | G06F 3/0421 |
| 9,801,254 B2* | 10/2017 | Hsing | ................... | H05B 33/10 |
| 9,846,510 B2* | 12/2017 | Rhee | ...................... | G06F 3/0412 |
| 9,870,106 B2* | 1/2018 | Miyake | ................ | G06F 3/044 |
| 2003/0026971 A1* | 2/2003 | Inkster | ...................... | B32B 5/18 428/304.4 |
| 2009/0273483 A1* | 11/2009 | Tompkins | ............... | G01L 1/142 340/657 |
| 2009/0279285 A1* | 11/2009 | Nakayama | ............ | C09K 11/06 362/97.3 |
| 2010/0020006 A1* | 1/2010 | Otani | ........................ | G01J 1/32 345/102 |
| 2010/0224880 A1* | 9/2010 | Kimura | ............... | H01L 27/1225 257/59 |
| 2011/0095320 A1* | 4/2011 | Hwang | ................... | H01L 27/15 257/98 |
| 2012/0013574 A1 | 1/2012 | Murai et al. | | |
| 2012/0013595 A1* | 1/2012 | Murai | ................ | G02F 1/13338 345/211 |
| 2012/0032155 A1* | 2/2012 | Mitsuya | .............. | H01L 27/3209 257/40 |
| 2012/0154337 A1* | 6/2012 | Kurokawa | ............. | G06F 3/042 345/175 |
| 2013/0169589 A1* | 7/2013 | Suzuki | .................... | G06F 3/041 345/174 |
| 2013/0277654 A1* | 10/2013 | Seo | ........................ | H01L 51/5262 257/40 |
| 2013/0285977 A1 | 10/2013 | Baharav et al. | | |
| 2016/0041428 A1* | 2/2016 | Hirakata | ............... | G02F 1/1334 345/212 |
| 2016/0118606 A1* | 4/2016 | Inoue | .................. | H01L 51/0025 257/40 |
| 2016/0118615 A1* | 4/2016 | Seo | ..................... | H01L 51/5092 257/40 |
| 2016/0253019 A1* | 9/2016 | Geaghan | ................. | G06F 3/041 345/174 |
| 2016/0378240 A1* | 12/2016 | Li | ......................... | G06F 3/0412 345/174 |
| 2017/0031476 A1 | 2/2017 | Kung | | |
| 2017/0194411 A1* | 7/2017 | Park | .................... | H01L 27/3276 |
| 2017/0316745 A1* | 11/2017 | Nakajima | ............... | G06F 3/044 |

FOREIGN PATENT DOCUMENTS

| | | |
|---|---|---|
| CN | 105094461 A | 11/2015 |
| EP | 2176632 A1 | 4/2010 |

* cited by examiner

| 0 | 1 | 0 |
| --- | --- | --- |
| 1 | 1 | 0 |
| 0 | 0 | 1 |
| 0 | 1 | 0 |
| 0 | 0 | 1 |

| 4 | 8 | 5 |
| --- | --- | --- |
| 8 | 9 | 8 |
| 8 | 10 | 9 |
| 7 | 8 | 9 |
| 6 | 7 | 7 |

FORCE TOUCH STRUCTURE, TOUCH DISPLAY PANEL, DISPLAY APPARATUS

RELATED APPLICATIONS

The present application claims the benefit of Chinese Patent Application No. 201610059794.8, filed on Jan. 28, 2016, the entire disclosure of which is incorporated herein by reference.

FIELD

The present disclosure relates to the field of touch technologies, and particularly to a force touch structure, a touch display panel and a display apparatus.

BACKGROUND

Prior art force touch has been applied more and more widely. The earliest force touch technology that came into view of the public is a watch with force touch function. The process thereof is to install a gravity sensing device at four corners of the watch respectively, thereby providing action feedbacks for three dimensions of light click, light press and heavy press. This enables the touch interaction to extend from the "time" dimension of long press to the "force" dimension of heavy press, which develops a brand-new space for the human-machine interaction.

However, the force touch function implemented in the prior art only identifies three kinds of forces, i.e. light, medium and heavy forces. Moreover, it is relatively easy for a small-size watch to realize force sensing, while it is relatively difficult for a large-size display to realize force sensing only by installing gravity sensing devices at four corners.

SUMMARY

Embodiments of the present disclosure provide a force touch structure, a touch display panel and a display apparatus, which can at least alleviate or even eliminate one or more deficiencies in the prior art.

Embodiments of the present disclosure provide a force touch structure comprising a base substrate, a light sensing device located on the base substrate, and a phosphorescence-emitting structure positionally corresponding to the light sensing device.

The phosphorescence-emitting structure comprises a first electrode, a second electrode, a phosphorescent layer located between the first electrode and the second electrode, and a flexible material layer located between the phosphorescent layer and the first electrode and/or located between the phosphorescent layer and the second electrode.

The first electrode receives a first voltage signal, the second electrode receives a second voltage signal, and the first electrode and the second electrode are used for forming a capacitor with a constant voltage value under the effects of the first voltage signal and the second voltage signal.

The light sensing device is used for receiving phosphorescence emitted by the phosphorescent layer and comparing an intensity of the received phosphorescence with a light intensity detected without force touch to determine the magnitude of force touch.

In the force touch structure provided by the embodiments of the present disclosure, the force touch structure comprises a light sensing device and a phosphorescence-emitting structure. The phosphorescence-emitting structure comprises a first electrode, a second electrode, a phosphorescent layer located between the first electrode and the second electrode, and a flexible material layer located between the phosphorescent layer and the first electrode and/or located between the phosphorescent layer and the second electrode. When there is an external force, the flexible material layer is deformed, and the distance between the first electrode and the second electrode is reduced, resulting in the capacitance value of the capacitor formed by the first electrode and the second electrode to increase. Since the voltage value of the capacitor formed by the first electrode and the second electrode does not change, amount of charges between the first electrode and the second electrode would increase as the capacitance value of the capacitor formed by the first electrode and the second electrode increases, further enhancing the intensity of the phosphorescence emitted by the phosphorescent layer. Since the light sensing device is used for receiving the phosphorescence emitted by the phosphorescent layer and comparing the intensity of the received phosphorescence with a light intensity detected without force touch to determine the magnitude of the force touch, the light sensing device can accurately detect the force touch according to the intensity of the received phosphorescence. As compared to the prior art, the embodiments of the present disclosure can implement more kinds of force identification functions.

In some embodiments, the first electrode is located below the phosphorescent layer, and the second electrode is located above the phosphorescent layer.

The light sensing device is located below the phosphorescence-emitting structure, the first electrode being a transparent electrode.

Or, the light sensing device is located above the phosphorescence-emitting structure, the second electrode being a transparent electrode.

In some embodiments, the light sensing device comprises a photosensitive diode and a control thin film transistor. The control thin film transistor is used, when turned on, for exporting a current of the photosensitive diode.

One side of the photosensitive diode is at least partially connected to a source or drain of the control thin film transistor, and the other side of the photosensitive diode is at least partially connected to a transparent electrode. The source or drain of the control thin film transistor which is at least partially connected to one side of the photosensitive diode is used for receiving a third voltage signal, the transparent electrode is used for receiving a fourth voltage signal, and the third voltage signal and the fourth voltage signal are constant-voltage signals with unequal voltage values.

In some embodiments, the force touch structure further comprises a light-shielding layer arranged on the base substrate, and the light-shielding layer is used for shielding light rays from an ambient environment which is incident into the light sensing device.

In some embodiments, a projection area of a portion of the transparent electrode which is connected to the photosensitive diode on the base substrate resides within a projection area of the light-shielding layer on the base substrate.

In some embodiments, the phosphorescence-emitting structure further comprises a buffer layer arranged between the phosphorescent layer and the flexible material layer.

Embodiments of the present disclosure further provide a touch display panel comprising the above force touch structure.

In some embodiments, the touch display panel comprises an array substrate and a color film substrate oppositely arranged to each other, and a black matrix located at a side of the array substrate facing the color film substrate, or a black matrix located at a side of the color film substrate facing the array substrate.

The force touch structure is arranged on the array substrate and/or the color film substrate.

In some embodiments, the force touch structure is arranged in an area positionally corresponding to the black matrix.

In some embodiments, the force touch structure is arranged on the array substrate. The first electrode or the second electrode of the force touch structure is arranged in the same layer as a pixel electrode or a common electrode on the array substrate.

In some embodiments, the force touch structure is arranged on the array substrate. The first electrode or the second electrode of the force touch structure is arranged in the same layer as a gate or a source and a drain on the array substrate.

In some embodiments, the touch display panel comprises an array substrate and a packaging cover plate oppositely arranged to each other, and an organic light-emitting structure arranged at a side of the array substrate facing the packaging cover plate.

The force touch structure is arranged on the array substrate and/or the packaging cover plate.

In some embodiments, the force touch structure is arranged in an area corresponding to a non-light emitting area of the touch display panel.

Embodiments of the present disclosure further provide a display apparatus comprising the above touch display panel.

DETAILED DESCRIPTION

Figure 1:
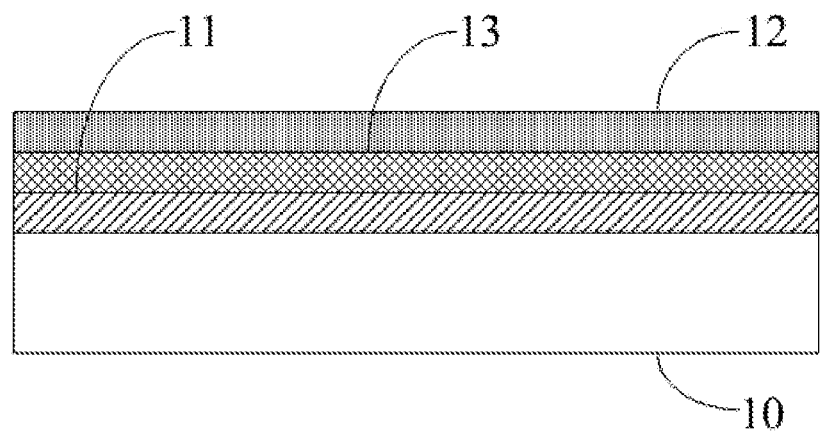
FIG. 1 is a schematic diagram of a force touch structure provided by embodiments of the present disclosure.

Embodiments of the present disclosure provide a force touch structure, a touch display panel and a display apparatus for implementing multiple functions of identifying forces and accurately detecting the force touch.

To make the objective, technical solutions and advantages of the present disclosure clearer, the present disclosure will be further described below in detail with reference to the drawings. Obviously, the described embodiments are just a part of the embodiments of the present disclosure rather than all of them. All other embodiments obtained by those ordinarily skilled in the art without spending inventive efforts on the basis of the embodiments in the present disclosure belong to the scope of the present disclosure.

The force touch structure provided by specific embodiments of the present disclosure is introduced below in detail with reference to the drawings.

The thicknesses of respective film layers and the sizes and shapes of the areas in the drawings do not reflect the real scale of the respective film layers, which are just for the purpose of schematically illustrating the present disclosure.

As shown in FIG. 1, the specific embodiments of the present disclosure provide a force touch structure comprising a base substrate 10, a light sensing device 11 located on the base substrate 10, and a phosphorescence-emitting structure 12 positionally corresponding to the light sensing device 11. Upon practical design, a transparent insulating layer 13 is designed between the light sensing device 11 and the phosphorescence-emitting structure 12, wherein transparent insulating materials commonly used in the prior art may be selected for the transparent insulating layer 13.

Figure 2:
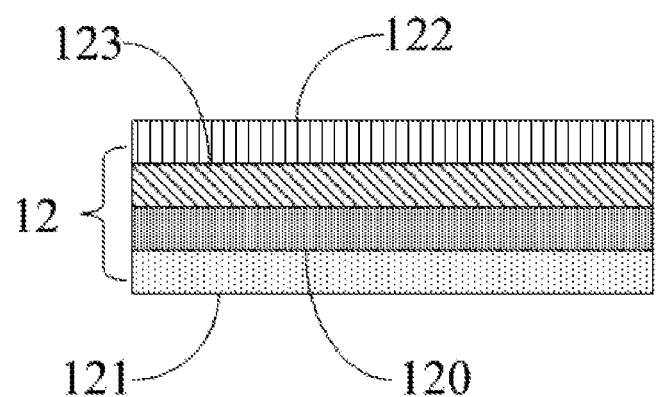
FIG. 2 is a schematic diagram of a phosphorescence-emitting structure provided by embodiments of the present disclosure.

As shown in FIG. 2, the phosphorescence-emitting structure 12 in the specific embodiments of the present disclosure comprises a first electrode 121, a second electrode 122, a phosphorescent layer 120 located between the first electrode 121 and the second electrode 122, and a flexible material layer 123 located between the phosphorescent layer 120 and the first electrode 121 and/or located between the phosphorescent layer 120 and the second electrode 122. Introduction is made in the drawings by only taking the example that the flexible material layer 123 is located between the phosphorescent layer 120 and the second electrode 122. The light sensing device 11 in FIG. 1 is used for receiving phosphorescence emitted by the phosphorescent layer 120 and compares an intensity of the received phosphorescence with a light intensity detected without force pressure, thereby determining the magnitude of the force touch.

The first electrode 121 receives a first voltage signal and the second electrode 122 receives a second voltage signal. The first electrode 121 and the second electrode 122 are used for forming a capacitor with a constant voltage value under the effects of the first voltage signal and the second voltage signal. The first voltage signal and the second voltage signal in the specific embodiments of the present disclosure are constant-voltage signals with unequal voltage values. For example, the voltage value to which the first voltage signal corresponds is Va, the voltage value to which the second voltage signal corresponds is Vb, and Va and Vb are constant-voltage signals with different values, e.g. Va=5V, Vb=3V. Moreover, the voltage value at two ends of the capacitor formed by the first electrode 121 and the second electrode 122 does not change.

Figure 3:
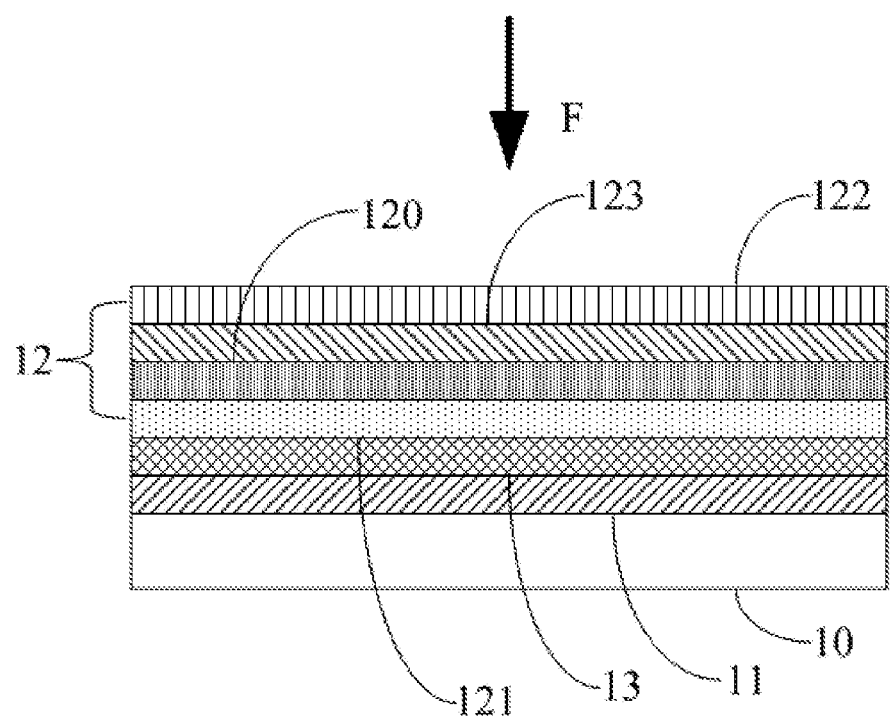
FIG. 3(a) and FIG. 3(b) are schematic diagrams of a positional relationship between a phosphorescence-emitting structure and a light sensing device comprised in a force touch structure provided by embodiments of the present disclosure.

Specifically, the light sensing device 11 in the specific embodiments of the present disclosure is located below the phosphorescence-emitting structure 12 as shown in FIG. 3(a), or the light sensing device 11 is located above the phosphorescence-emitting structure 12 as shown in FIG. 3(b). Introduction is made in the specific embodiments of the present disclosure by taking the example that the first electrode 121 is located below the phosphorescent layer 120 and the second electrode 122 is located above the phosphorescent layer 120. In such cases, when the light sensing device 11 is located below the phosphorescence-emitting structure 12, the first electrode 121 is a transparent electrode; when the light sensing device 11 is located above the phosphorescence-emitting structure 12, the second electrode 122 is a transparent electrode. The base substrate 10 in the specific embodiments of the present disclosure is a glass substrate. Certainly, during the practical production, the base substrate 10 may further be a substrate of other types such as a ceramic substrate or a flexible substrate, and so on.

The process and principle of implementing the force touch in the specific embodiments of the present disclosure are specifically set forth below with reference to FIG. 3(a) and FIG. 3(b).

As shown in FIG. 3(a) and FIG. 3(b), when the force touch structure is pressed, for example, there is an external force F, it would cause deformation of the flexible material layer 123. After the deformation of the flexible material layer 123, the distance between the first electrode 121 and the second electrode 122 respectively located at two sides of the phosphorescent layer 120 becomes smaller. Since the first electrode 121 and the second electrode 122 in the specific embodiments of the present disclosure form a capacitor, when the distance between the first electrode 121 and the second electrode 122 becomes smaller, in accordance with the capacitance formula of a capacitor, $C=\varepsilon S/d$ where $\varepsilon$ is a dielectric constant of a dielectric between two electrodes, S is the area of the two electrodes that constitute the capacitor, and d is the distance between the two electrodes that constitute the capacitor, E is a constant, S is the area of the first electrode 121 or the second electrode 122, the areas of the first electrode 121 and the second electrode 122 in the specific embodiments of the present disclosure do not change, either, and the distance between the first electrode 121 and the second electrode 122 in the specific embodiments of the present disclosure becomes smaller under the effect of the external force F. Accordingly, when there is the external force F, the capacitance value of the capacitor formed by the first electrode 121 and the second electrode 122 increases.

Furthermore, in accordance with the formula between capacitance, voltage and charge, $C=Q/U$, since the capacitance value of the capacitor formed by the first electrode 121 and the second electrode 122 increases under the effect of the external force F in specific embodiments of the present disclosure, and the voltage value of the capacitor formed by the first electrode 121 and the second electrode 122 does not change, the amount of charges Q increases when there is the external force F, that is, the amount of charges in the phosphorescent layer 120 increases at that time.

When the amount of charges in the phosphorescent layer 120 increases, the intensity of the phosphorescence emitted by the phosphorescent layer 120 is enhanced. As the external force F increases constantly, the amount of charges Q in the phosphorescent layer 120 also constantly increases. Since the light sensing device 11 is used for receiving the phosphorescence emitted by the phosphorescent layer 120, the light intensity received by the light sensing device 11 is also constantly enhanced.

As shown in FIG. 3(a), the phosphorescence-emitting structure 12 is located above the light sensing device 11. In such cases, the first electrode 121 comprised in the phosphorescence-emitting structure 12 is a transparent electrode in order to ensure that the light sensing device 11 can well receive the phosphorescence emitted by the phosphorescent layer 120. For example, the material of the first electrode 121 is a monolayer film of indium tin oxide (ITO), or a monolayer film of indium zinc oxide (IZO), or a composite film of ITO and IZO. The second electrode 122 in the specific embodiments of the present disclosure may be a transparent electrode and may also be an opaque metal electrode. When the second electrode 122 in the specific embodiments of the present disclosure is an opaque metal electrode, the phosphorescence emitted by the phosphorescent layer 120 would not exit from one side of the second electrode 122 above, but can only be transmitted downwards to irradiate the light sensing device 11, which can consequently improve the utilization rate of the phosphorescence emitted by the phosphorescent layer 120 and better implement the force touch function of the present disclosure.

As shown in FIG. 3(b), the phosphorescence-emitting structure 12 is located below the light sensing device 11. In such cases, the flexible material layer 123 comprised in the phosphorescence-emitting structure 12 is of a transparent material and the second electrode 122 is a transparent electrode in order to ensure that the light sensing device 11 can well receive the phosphorescence emitted by the phosphorescent layer 120. For example, the material of the second electrode 122 is a monolayer film of ITO, or a monolayer film of IZO, or a composite film of ITO and IZO. In such cases, the first electrode 121 in the specific embodiments of the present disclosure may be a transparent electrode and may also be an opaque metal electrode. When the first electrode 121 in the specific embodiments of the present disclosure is an opaque metal electrode, the phosphorescence emitted by the phosphorescent layer 120 would not exit from one side of the first electrode 122 below, but can only be transmitted upwards to irradiate the light sensing device 11, which can consequently improve the utilization rate of the phosphorescence emitted by the phosphorescent layer 120 and better implement the force touch function of the present disclosure.

A specific method for determining the magnitude of the force touch by the light sensing device 11 according to the intensity of the received phosphorescence in the specific embodiments of the present disclosure comprises: the light sensing device 11 converting the intensity of the received phosphorescence into an electric signal, e.g. converting it into a current signal. The stronger the intensity of the received phosphorescence is, the larger the current formed by conversion is, and the larger the external force F is. When there is no external force F, the light sensing device 11 detects a light intensity at that time and employs the light intensity detected at that time as a noise light intensity, for example, the noise light intensity includes the light intensity of the ambient environment as detected. When there is an external force F, for example, there is finger press, the light sensing device 11 detects a light intensity at that time. The light intensity detected at that time primarily includes the intensity of the phosphorescence emitted by the phosphorescent layer 120 besides including the noise light intensity. The light sensing device 11 compares the light intensity detected at that time with the noise light intensity to determine the magnitude of the force touch.

Figures 3, 4:
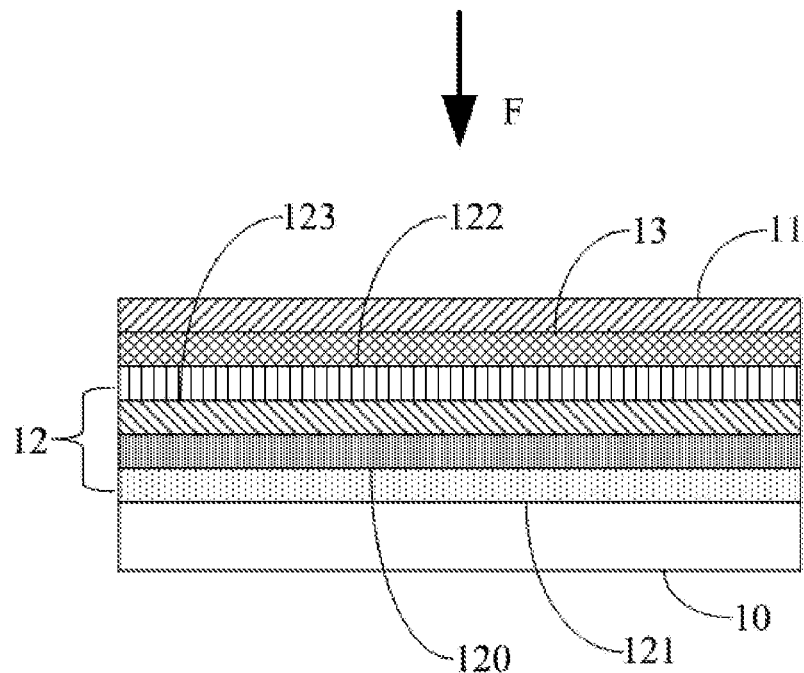
FIG. 4(a) and FIG. 4(b) illustratively show current values to which the light intensities in respective areas on the force touch structure surface correspond when there is no external force and there is an external force acts on the force touch structure, respectively.

Upon implementation, the light sensing device 11 converts the detected noise light intensity into a current value. FIG. 4(a) and FIG. 4(b) illustratively show current values to which the light intensities in respective areas on the force touch structure surface correspond when there is no external force and there is an external force acts on the force touch structure, respectively. By comparing the current values in corresponding areas as shown in FIG. 4(a) and FIG. 4(b), the magnitude of the force touch can be confirmed. The magnitude of the force touch in the specific embodiments of the present disclosure is represented by press coordinate values. Specifically, the differences between the current values at respective positions in FIG. 4(a) and the current values at respective positions in FIG. 4(b) are corresponding current values when a finger presses the corresponding positions.

The light sensing device 11 in the specific embodiments of the present disclosure preestablishes a correspondence table between current values and press coordinates.

As can be seen from the results of comparison between FIG. 4(a) and FIG. 4(b), the current value corresponding to finger press is 10, and the area to which the current value corresponds is a central area of the finger. By looking up the preestablished correspondence table between current values and press coordinates, the press coordinates corresponding to the current value 10 are press coordinate values of the central area of the finger. Likewise, in the specific embodiments of the present disclosure, upon finger press, besides the central area of the finger has obvious force touch, other areas would also have force touch. According to the method for determining the press coordinate values of the central area of the finger, the press coordinate values of other areas can also be obtained in the specific embodiments of the present disclosure. The specific embodiments of the present disclosure can realize continuous detection of the finger press force, that is, the change in the magnitude of the press force is similar to a continuously varying function rater than a jump function.

It is to be noted that although the surface of the force touch structure is schematically divided into 5*3 areas in FIG. 4(a) and FIG. 4(b), this is just for illustrative purpose. Those skilled in the art can divide the surface of the force touch structure into more or fewer areas dependent on practical needs, and the more the areas are, the higher the sensitivity of the force touch sensing is.

Figures 4, 5:
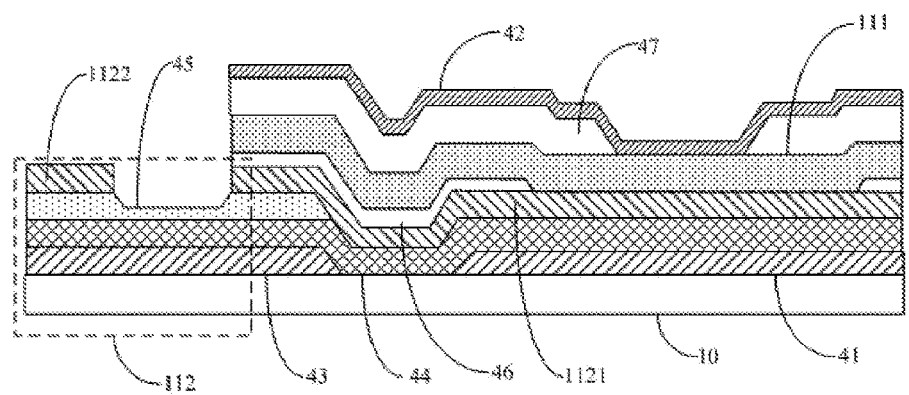
FIG. 5 is a structural schematic diagram of a light sensing device provided by embodiments of the present disclosure.

In the specific embodiments of the present disclosure, the smaller the noise light intensity detected by the light sensing device is, the more accurate the obtained magnitude of the force touch is. In order to reduce the noise light intensity detected by the light sensing device, the specific embodiments of the present disclosure may further comprise, as shown in FIG. 5, a light-shielding layer 41 on the base substrate 10. The light-shielding layer 41 is used for shielding light rays from an ambient environment which is incident into the light sensing device.

Specifically, as shown in FIG. 5, the light sensing device in the specific embodiments of the present disclosure comprises a photosensitive diode 111 and a control thin film transistor 112. The control thin film transistor 112 is used, when turned on, for exporting the current of the photosensitive diode 111. One side of the photosensitive diode 111 is at least partially connected to a source 1121 or drain 1122 of the control thin film transistor 112. Here, explanation is made by taking the example that one side of the photosensitive diode 111 is connected to the source 1121 of the control thin film transistor 112. The other side of the photosensitive diode 111 is at least partially connected to a transparent electrode 42. The source 1121 of the control thin film transistor 112 is used for receiving a third voltage signal, the transparent electrode 42 is used for receiving a fourth voltage signal, and the third voltage signal and the fourth voltage signal are constant-voltage signals with unequal voltage values. At that time, the voltage value at two ends of the photosensitive diode 111 does not change.

As shown in FIG. 5, the control thin film transistor 112 comprises a gate 43, a gate insulating layer 44, an active layer 45, a source 1121 and a drain 1122. During the practical production, a specific method for manufacturing the control thin film transistor 112 is similar to the prior art method for manufacturing a thin film transistor in the pixel unit of an array substrate, unnecessary details of which are not described here.

As shown in FIG. 5, an insulating layer 46 is arranged between the portion of the photosensitive diode 111 which is not connected to the source 1121 of the control thin film transistor 112 and the source 1121 of the control thin film transistor 112, and an insulating layer 47 is arranged between the portion of the photosensitive diode 111 which is not connected to the transparent electrode 42 and the transparent electrode 42. The materials of the insulating layers in the specific embodiments of the present disclosure are selected as insulating materials commonly used in the prior art, e.g. silicon oxide and/or silicon nitride. In order to provide a voltage signal to the photosensitive diode 111, the photosensitive diode 111 needs to have portions connected to the source 1121 and the transparent electrode 42 to achieve electrical connections. In the specific embodiments of the present disclosure, the projection area of the portion of the transparent electrode 42 which is connected to the photosensitive diode 111 on the base substrate 10 resides within the projection area of the light-shielding layer 41 on the base substrate 10, which can reduce the noise light intensity detected by the light sensing device.

As shown in FIG. 5, when light sensing device in the specific embodiments of the present disclosure is located below the phosphorescence-emitting structure as shown in FIG. 3(a), the transparent electrode 42 is located above the source 1121, i.e. the design as shown in FIG. 5. When light sensing device in the specific embodiments of the present disclosure is located above the phosphorescence-emitting structure as shown in FIG. 3(b), the transparent electrode 42 needs to be located below the source 1121 such that the phosphorescence emitted by the phosphorescent layer can irradiate the photosensitive diode 111.

During the practical detection by the light sensing device, when there is light irradiates the photosensitive diode 111, the resistance of the photosensitive layer thereof is changed. When the gate 43 of the control thin film transistor 112 is applied with a voltage to turn on the control thin film transistor 112, since the voltage signals received by the source 1121 and the transparent electrode 42 are constant-voltage signals, the voltage of the photosensitive layer does not change. When the resistance of the photosensitive layer is changed, in accordance with the relationship between voltage, resistance and current, in the case that the voltage is constant, the current exported via the control thin film transistor 112 also changes correspondingly. The larger the exported current is, the stronger the intensity of light that irradiates the photosensitive diode 111 is. Different light intensities reflect different press forces, and press coordinates are further obtained by means of the light intensities.

Figure 6:
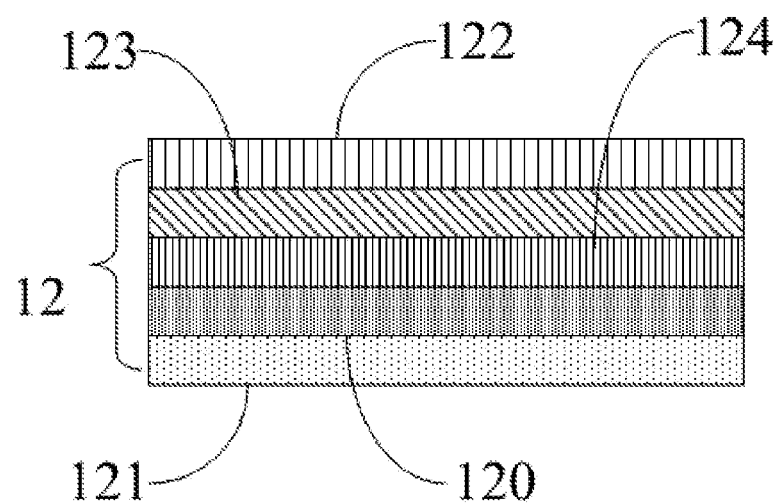
FIG. 6 is a schematic diagram of another phosphorescence-emitting structure provided by embodiments of the present disclosure.

Alternatively, as shown in FIG. 6, the phosphorescence-emitting structure 12 in the specific embodiments of the present disclosure further comprises a buffer layer 124 arranged between the phosphorescent layer 120 and the flexible material layer 123. The arrangement of the buffer layer 124 can avoid impurity interference between the flexible material layer 123 and the phosphorescent layer 120, which can better achieve luminescence of the phosphorescent layer 120.

The specific embodiments of the present disclosure further provide a touch display panel comprising the above force touch structure.

The force touch structure in the specific embodiments of the present disclosure may be applied in a liquid crystal display (LCD) and may also be applied in an organic light emitting diode (OLED) display.

Figure 7:
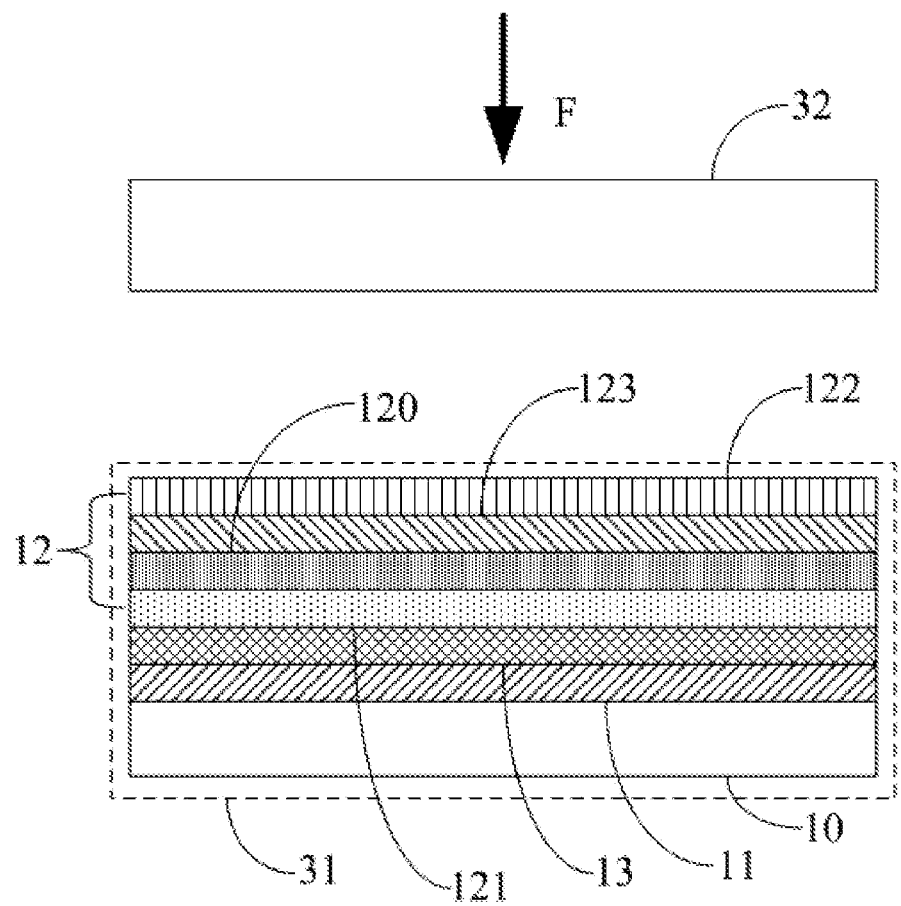
FIG. 7 is a structural schematic diagram of a touch display panel provided by embodiments of the present disclosure.

Specifically, when the force touch structure provided by the specific embodiments of the present disclosure is applied in an LCD, as shown in FIG. 7, the touch display panel in the specific embodiments of the present disclosure comprises an array substrate 31 and a color film substrate 32 oppositely arranged to each other, and a black matrix (not shown) located at a side of the array substrate 31 facing the color film substrate 32, or a black matrix (not shown) located at a side of the color film substrate 32 facing the array substrate 31. The force touch structure is arranged on the array substrate 31 and/or color film substrate 32. FIG. 7 only illustrates the situation of arranging the force touch structure on the array substrate 31. The black matrix is specifically arranged in the same manner as the prior art, unnecessary details of which are not described here.

Upon specific implementation, when the force touch structure in the specific embodiments of the present disclosure is arranged on the array substrate, the base substrate for manufacturing the array substrate may be the same as the base substrate of the force touch structure. When the first electrode comprised in the force touch structure in the specific embodiments of the present disclosure is a transparent electrode, the first electrode is arranged in the same layer as the pixel electrode on the array substrate, or arranged in the same layer as the common electrode on the array substrate, or an electrode formed by an individually arranged transparent conductive layer. When the first electrode is arranged in the same layer as the pixel electrode on the array substrate or arranged in the same layer as the common electrode on the array substrate, during the practical production, the first electrode can be manufactured simultaneously with the pixel electrode on the array substrate or the common electrode on the array substrate, which saves the process procedure and the process time as well as reduces the production cost.

Likewise, when the second electrode comprised in the force touch structure in the specific embodiments of the present disclosure is a transparent electrode, the second electrode may also be arranged in the same layer as the pixel electrode on the array substrate, or arranged in the same layer as the common electrode on the array substrate, or an electrode formed by an individually arranged transparent conductive layer.

When the second electrode comprised in the force touch structure in the specific embodiments of the present disclosure is an opaque metal electrode, the second electrode may be arranged in the same layer as the gate on the array substrate, or arranged in the same layer as the source and the drain on the array substrate, or an electrode formed by an individually arranged metal layer. When the second electrode is arranged in the same layer as the gate on the array substrate or as the source and the drain on the array substrate, during the practical production, the second electrode can be manufactured simultaneously with the gate on the array substrate or the source and the drain on the array substrate, which saves the process procedure and the process time as well as reduces the production cost.

Likewise, when the first electrode comprised in the force touch structure in the specific embodiments of the present disclosure is an opaque metal electrode, the first electrode may be arranged in the same layer as the gate on the array substrate, or arranged in the same layer as the source and the drain on the array substrate, or an electrode formed by an individually arranged metal layer.

During the practical production, in order to prevent the force touch structure provided by the specific embodiments of the present disclosure from impacting on the aperture ratio of the display panel formed by the array substrate and the color film substrate, the force touch structure in the specific embodiments of the present disclosure is arranged in an area positionally corresponding to the black matrix.

Specifically, when the force touch structure provided by the specific embodiments of the present disclosure is applied in an OLED, the touch display panel in the specific embodiments of the present disclosure comprises an array substrate and a packaging cover plate oppositely arranged to each other, and an organic light-emitting structure arranged at a side of the array substrate facing the packaging cover plate. The force touch structure is arranged on the array substrate and/or the packaging cover plate. Upon specific implementation, the force touch structure in the specific embodiments of the present disclosure may be arranged in an area corresponding to a non-light emitting area. The array substrate, the packaging cover plate and the organic light-emitting structure are arranged in the same manner as the prior art, unnecessary details of which are not described here.

The specific embodiments of the present disclosure further provide a display apparatus comprising the above touch display panel. The display apparatus may be a liquid crystal panel, a liquid crystal display, a liquid crystal television, an organic light-emitting diode (OLED) panel, an OLED display, an OLED television or an electronic paper, and so on.

In summary, the specific embodiments of the present disclosure provide a force touch structure comprising a base substrate, a light sensing device located on the base substrate, and a phosphorescence-emitting structure positionally corresponding to the light sensing device. The phosphorescence-emitting structure comprises a first electrode, a second electrode, a phosphorescent layer located between the first electrode and the second electrode, and a flexible material layer located between the phosphorescent layer and the first electrode and/or located between the phosphorescent layer and the second electrode. The first electrode receives a first voltage signal, the second electrode receives a second voltage signal, and the first electrode and the second electrode are used for forming a capacitor with a constant voltage value under the effects of the first voltage signal and the second voltage signal. The light sensing device is used for receiving phosphorescence emitted by the phosphorescent layer and comparing the intensity of the received phosphorescence with a light intensity detected without force touch to determine the magnitude of the force touch. When there is an external force, the flexible material layer is deformed, and the distance between the first electrode and the second electrode is reduced, resulting the capacitance value of the capacitor formed by the first electrode and the second electrode to increase. Since the voltage value of the capacitor formed by the first electrode and the second electrode does not change, the amount of charges between the first electrode and the second electrode increases, which further enhances the intensity of the phosphorescence emitted by the phosphorescent layer. Since the light sensing device is used for receiving the phosphorescence emitted by the phosphorescent layer and comparing the intensity of the received phosphorescence with a light intensity detected without force touch to determine the magnitude of the force touch, the light sensing device can accurately detect the force touch according to the intensity of the received phosphorescence. As compared to the prior art, the specific embodiments of the present disclosure can not only implement the function of identifying three kinds of forces, i.e. light, medium and heavy forces, but also implement more kinds of force identification functions.

It is to be noted that the terms "above" and "below" as used in the present disclosure are defined in light of the orientation shown in the drawings and are only used for representing relative positional relationships between respective film layers and structures.

Obviously, those skilled in the art may make various modifications and variations to the present disclosure without departing from the spirit and scope of the present disclosure. In this way, if these modifications and variations to the present disclosure belong to the scope of the claims of the present disclosure and equivalent technologies thereof, the present disclosure also intends to include these modifications and variations.

The invention claimed is:

1. A force touch structure comprising a base substrate, a light sensing device located on the base substrate, and a phosphorescence-emitting structure positionally corresponding to the light sensing device, wherein
the phosphorescence-emitting structure comprising a first electrode, a second electrode, a phosphorescent layer located between the first electrode and the second electrode, and a flexible material layer located between the phosphorescent layer and one of the first electrode and the second electrode, the first electrode receives a first voltage signal, the second electrode receives a second voltage signal, and a voltage difference between the first voltage signal and the second voltage signal is constant and is nonzero;
the first electrode, the second electrode, the phosphorescent layer and the flexible material layer constitute a capacitor, the capacitor is configured to change an amount of charges in the phosphorescent layer according to a magnitude of force applied on the force touch structure, and the phosphorescent layer is configured to change an intensity of phosphorescence emitted by the phosphorescent layer according to the amount of charges; and
the light sensing device is configured to receive the phosphorescence emitted by the phosphorescent layer, and determine the magnitude of the force according to the intensity of the received phosphorescence.

2. The force touch structure according to claim 1, wherein the first electrode is located below the phosphorescent layer, the second electrode is located above the phosphorescent layer;
the light sensing device is located below the phosphorescence-emitting structure, the first electrode being a transparent electrode; or
the light sensing device is located above the phosphorescence-emitting structure, the second electrode being a transparent electrode.

3. The force touch structure according to claim 1, wherein the light sensing device comprises a photosensitive diode and a control thin film transistor, the control thin film transistor being used, when turned on, for exporting a current of the photosensitive diode;
one side of the photosensitive diode being at least partially connected to a source or drain of the control thin film transistor, the other side of the photosensitive diode being at least partially connected to a transparent electrode, the source or drain of the control thin film transistor which is at least partially connected to one side of the photosensitive diode being used for receiving a third voltage signal, the transparent electrode being used for receiving a fourth voltage signal, the third voltage signal and the fourth voltage signal being constant-voltage signals with unequal voltage values.

4. The force touch structure according to claim 3, further comprising a light-shielding layer arranged on the base substrate, the light-shielding layer being used for shielding light rays from an ambient environment which is incident into the light sensing device.

5. The force touch structure according to claim 4, wherein a projection area of a portion of the transparent electrode which is connected to the photosensitive diode on the base substrate resides within a projection area of the light-shielding layer on the base substrate.

6. The force touch structure according to claim 1, wherein the phosphorescence-emitting structure further comprises a buffer layer arranged between the phosphorescent layer and the flexible material layer.

7. A touch display panel comprising a force touch structure, the force touch structure comprising a base substrate, a light sensing device located on the base substrate, and a phosphorescence-emitting structure positionally corresponding to the light sensing device, wherein
the phosphorescence-emitting structure comprising a first electrode, a second electrode, a phosphorescent layer located between the first electrode and the second electrode, and a flexible material layer located between the phosphorescent layer and one of the first electrode and the second electrode, the first electrode receives a first voltage signal, the second electrode receives a second voltage signal, and a voltage difference between the first voltage signal and the second voltage signal is constant and is nonzero;
the first electrode, the second electrode, the phosphorescent layer and the flexible material layer constitute a capacitor, the capacitor is configured to change an amount of charges in the phosphorescent layer according to a magnitude of force applied on the force touch structure, and the phosphorescent layer is configured to change an intensity of phosphorescence emitted by the phosphorescent layer according to the amount of charges; and
the light sensing device is configured to receive the phosphorescence emitted by the phosphorescent layer, and determine the magnitude of the force according to the intensity of the received phosphorescence.

8. The touch display panel according to claim 7, wherein the first electrode is located below the phosphorescent layer, the second electrode is located above the phosphorescent layer,
the light sensing device is located below the phosphorescence-emitting structure, the first electrode being a transparent electrode; or
the light sensing device is located above the phosphorescence-emitting structure, the second electrode being a transparent electrode.

9. A display device comprising the touch display panel according to claim 8.

10. The touch display panel according to claim 7, wherein the light sensing device comprises a photosensitive diode and a control thin film transistor, the control thin film transistor being used, when turned on, for exporting a current of the photosensitive diode;
one side of the photosensitive diode being at least partially connected to a source or drain of the control thin film transistor, the other side of the photosensitive diode being at least partially connected to a transparent electrode, the source or drain of the control thin film transistor which is at least partially connected to one side of the photosensitive diode being used for receiving a third voltage signal, the transparent electrode being used for receiving a fourth voltage signal, the third voltage signal and the fourth voltage signal being constant-voltage signals with unequal voltage values.

11. The touch display panel according to claim 10, further comprising a light-shielding layer arranged on the base substrate, the light-shielding layer being used for shielding light rays from an ambient environment which is incident into the light sensing device.

12. The touch display panel according to claim 11, wherein a projection area of a portion of the transparent electrode which is connected to the photosensitive diode resides on the base substrate within a projection area of the light-shielding layer on the base substrate.

13. The touch display panel according to claim 7, wherein the phosphorescence-emitting structure further comprises a buffer layer arranged between the phosphorescent layer and the flexible material layer.

14. The touch display panel according to claim 7, comprising an array substrate and a color film substrate oppositely arranged to each other, and a black matrix located at a side of the array substrate facing the color film substrate, or a black matrix located at a side of the color film substrate facing the array substrate;
the force touch structure being arranged on the array substrate and/or the color film substrate.

15. The touch display panel according to claim 14, wherein the force touch structure is arranged in an area positionally corresponding to the black matrix.

16. The touch display panel according to claim 14, wherein the force touch structure is arranged on the array substrate, the first electrode or the second electrode of the force touch structure being arranged in the same layer as a pixel electrode or a common electrode on the array substrate.

17. The touch display panel according to claim 14, wherein the force touch structure is arranged on the array substrate, the first electrode or the second electrode of the force touch structure being arranged in the same layer as a gate or a source and a drain on the array substrate.

18. The touch display panel according to claim 7, comprising an array substrate and a packaging cover plate oppositely arranged to each other, and an organic light-emitting structure arranged at a side of the array substrate facing the packaging cover plate;
the force touch structure being arranged on the array substrate and/or the packaging cover plate.

19. The touch display panel according to claim 18, wherein the force touch structure is arranged in an area corresponding to a non-light emitting area of the touch display panel.

20. A display device comprising the touch display panel according to claim 7.

* * * * *